US011221376B2

(12) United States Patent
Morin et al.

(10) Patent No.: US 11,221,376 B2
(45) Date of Patent: Jan. 11, 2022

(54) LOAD BANK ASSEMBLY

(71) Applicant: Comrent International, LLC, Newburg, MD (US)

(72) Inventors: Joseph Morin, Kankakee, IL (US); Brian Kelleher, Plano, TX (US); Lowell Seal, Reisterstown, MD (US); Brett Gidge, Mt. Airy, MD (US); Todd Locker, Canonsburg, PA (US); Graham Thompson, Coraopolis, PA (US)

(73) Assignee: COMRENT INTERNATIONAL, LLC, Newburg, MD (US)

(*) Notice: Subject to any disclaimer, the term of this patent is extended or adjusted under 35 U.S.C. 154(b) by 0 days.

(21) Appl. No.: 17/130,069

(22) Filed: Dec. 22, 2020

(65) Prior Publication Data

US 2021/0116514 A1 Apr. 22, 2021

Related U.S. Application Data

(62) Division of application No. 16/113,147, filed on Aug. 27, 2018, now Pat. No. 10,908,226, which is a division of application No. 15/142,562, filed on Apr. 29, 2016, now Pat. No. 10,184,989.

(51) Int. Cl.
*G01R 31/40* (2020.01)

(52) U.S. Cl.
CPC ................... *G01R 31/40* (2013.01)

(58) Field of Classification Search
CPC ....................................... G01R 31/40

USPC .................... 324/764.01, 537, 500
See application file for complete search history.

(56) References Cited

U.S. PATENT DOCUMENTS

| 4,445,047 A | 4/1984 | Cannon |
| 6,833,636 B1 | 12/2004 | Nestel et al. |
| 8,483,982 B2 | 7/2013 | Hancock et al. |
| 9,488,694 B2 | 11/2016 | Kondo |
| 10,488,468 B2 | 11/2019 | Tai |
| 2008/0303138 A1* | 12/2008 | Flett ................. H01L 25/18 257/714 |
| 2012/0105097 A1 | 5/2012 | Hancock et al. |
| 2018/0142630 A1* | 5/2018 | Boggs ............. F02D 41/0245 |
| 2019/0204391 A1* | 7/2019 | Cottuli ............ H01M 8/04947 |

* cited by examiner

Primary Examiner — Giovanni Astacio-Oquendo
(74) Attorney, Agent, or Firm — Laubscher & Laubscher, P.C.

(57) ABSTRACT

A load bank for testing power sources includes a load resistor assembly having a plurality of resistors which can be switched between wye and delta configurations for testing a variety of voltages and power sources requiring various load applications. First and second power connections are connected with primary and redundant power sources and a relay alternately connects the first and second power connections with the load resistor assembly for alternately testing the primary and redundant power sources while maintaining the sources electrically isolated. A damper is arranged adjacent the load resistor assembly and is operable between an open position which permits cold air to be delivered to the load resistor assembly to cool the assembly when the load bank is operating and a closed position which prevents hot air from being recirculated when the load bank is not operating.

6 Claims, 3 Drawing Sheets

LOAD BANK ASSEMBLY

This application is a division of U.S. application Ser. No. 16/113,147 filed Aug. 27, 2018 which was a division of U.S. application Ser. No. 15/142,562 filed Apr. 29, 2016.

BACKGROUND OF THE INVENTION

Load banks are used to test new data center installations or upgrades and have two primary objectives. One objective is to test the power infrastructure in a building to insure that it is able to reliably provide power to the server racks of the data center in both normal and emergency power conditions. The second objective is to test and optimize the heating, cooling and ventilation (HVAC) system within the data center to insure that it is capable of cooling all of the heat generating equipment in the server racks and that the HVAC system has been sufficiently optimized to reduce operating costs. The present invention relates to a load bank assembly that can be configured to provide versatility for testing various power sources and includes an innovative cooling system for the assembly.

Traditionally a load bank puts a specific power draw on the power source to simulate a computer operating in a server rack. Just as a computer generates heat, a load bank generates heat as well. The heat is evacuated from the load bank using one or more fans that draw cool air in from a cold aisle and discharges hot air into a hot aisle. During the testing of a data center, many load banks are installed and utilized to conduct the testing. Each load bank is subject to its own operating condition and some load banks may not be operating at all. In load bank assemblies available on the market today, any load banks not being used are turned off while the other units continue to operate and generate heat. The desired result is that all heat exhausted into the hot aisle is routed to the HVAC system. However, some of the air recirculates through any load banks not presently turned on and returns to the cold aisle. This invalidates the test and is thus undesirable. In an effort to solve the problem, makeshift baffles such as a piece of cardboard or a thin sheet of metal are used to physically block the intake of any load banks not in use. This process introduces manual error and is time consuming. It could also pose a safety threat if a load bank is returned to service and the baffle is not removed.

BRIEF DESCRIPTION OF THE PRIOR ART

It is known in the art to provide a load bank with resistor assemblies connected in different configurations. The Nestel U.S. Pat. No. 6,833,636 discloses a load bank for testing power systems in which heater elements are connected in a delta configuration, but indicates that the elements may also be connected in a wye configuration. However, there is no teaching of reconfiguring the elements between the delta and wye configurations.

It is also known in the art to provide load systems which are capable of testing emergency or backup power supply systems. The Hancock U.S. Pat. No. 8,483,982, for example, discloses an automated emergency power supply system and testing solution for an alternate power source of a building. However, such known systems are not capable of switching back and forth between main and redundant or backup power systems for testing the systems using the same load resistor assembly.

The present invention was developed in order to overcome these and other drawbacks of prior load banks by providing a versatile load bank assembly which can be configured as necessary to test various power sources while also improving the cooling capabilities of the load bank.

SUMMARY OF THE INVENTION

Accordingly, it is a primary object of the invention to provide a load bank for testing a variety of power sources and voltages with various load applications. The load bank includes a plurality of inputs having different phases, a resistor connected with each of the phase inputs, respectively, and a relay connected with each of the resistors. Each relay is operable to connect each resistor with one of a neutral input and another phase input, respectively, so that the resistors can be connected in wye and delta configurations by selective operation of the relays. More particularly, when the load bank is connected in the wye configuration, the resistors connected with the first, second, and third phase inputs are connected with the neutral input. When the load bank is connected in the delta configuration, the resistor connected with the first phase input is connected with the second phase input, the resistor connected with the second phase input is connected with the third phase input, and the resistor connected with the third phase input is connected with the first phase input.

According to a further object of the invention, the load bank is capable of testing both primary and redundant power sources. It includes a first set of power connections connected with the primary power source, a second set of power connections connected with the redundant power source, a load resistor assembly for testing the power sources, a multi-pole relay for alternately connecting the first and second power connections with the load resistor assembly, respectively, so that the primary and secondary power sources may be tested with the same load resistor assembly while remaining electrically isolated. A protective contactor circuit is arranged between the load resistor assembly and the multi-pole relay.

It is yet another object of the invention to provide a load bank and cooling assembly including a housing having a cold air inlet on one side and a hot air outlet on a side opposite the cold air inlet and a load resistor assembly arranged in the housing. A blower is also arranged in the housing adjacent the cold air inlet for circulating cold air through the load resistor assembly to cool the load resistor assembly via heat exchange which results in hot air which exits the housing via the hot air outlet. A damper is arranged in the housing between the blower and the load resistor assembly and is operable between an open position when the load bank is in operation so that cold air from the blower is delivered to the load resistor assembly and a closed position when the load bank is not in operation so that cold air is prevented from passing to the load resistor assembly.

According to a more specific embodiment of the invention, a controller is connected with the relays to control the operation of the relays to switch the load bank between the wye and delta configurations. The controller is also connected with the multi-pole relay to control its operation for alternately testing the primary and redundant power sources. A solenoid is connected with the damper to operate the damper between the open and closed position. The controller is also connected with the damper to control its operation.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
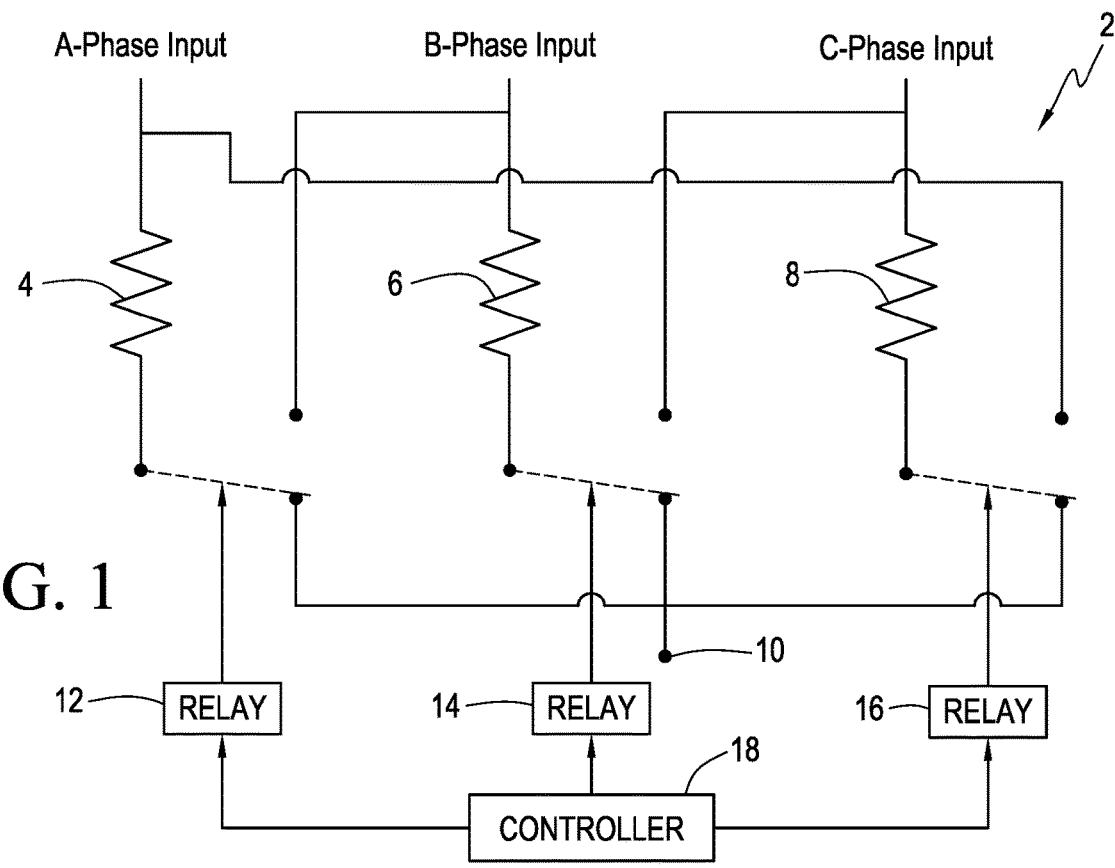
FIGS. 1 and 2 are circuit diagram of the load bank connected in wye and delta configurations, respectively.

Referring to FIG. 1, there is shown a load bank assembly 2 which is configured in a wye connection. More particularly, the load bank assembly includes a plurality of parallel resistors that can be configured in different manners. Each resistor is connected in series with a different phase input. In the example shown in FIG. 1, a first resistor 4 is shown connected with an A-phase input, a second resistor 6 is shown connected with a B-phase input, and a third resistor 8 is connected with a C-phase input. The load bank further includes a neutral input 10 for selective connection with the resistors on an end opposite the A, B, and C phase inputs, respectively.

Figure 2:
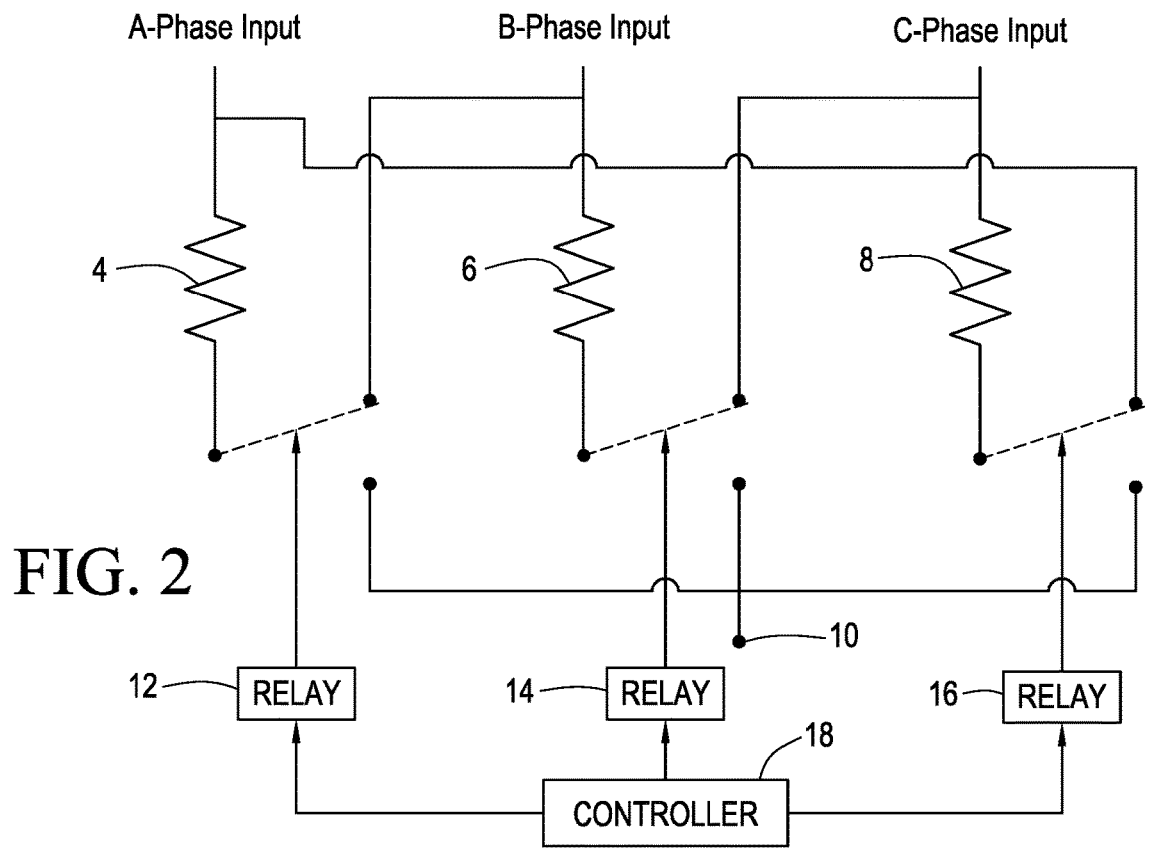

A first relay 12 is connected with the first resistor 4, a second relay 14 is connected with the second resistor 6, and a third relay 16 is connected with the third resistor 8. Each relay is operable to connect its associated resistor with either the neutral input 10 as shown in FIG. 1 or with another phase input as shown in FIG. 2. When the resistors are connected with the neutral input as shown in FIG. 1, the resistors are in a wye configuration, and when the resistors are connected with another phase input as shown in FIG. 2, the resistors are in a delta configuration. Preferably, when in the delta configuration, the first resistor 4 is connected with the B-phase input, the second resistor 6 is connected with the C-phase input, and the third resistor 8 is connected with the A-phase input.

A controller 18 is connected with the relays 12, 14, and 16 to control the operation of the relays and thus configure the load bank in the wye and delta configurations. One example of a suitable controller is a microprocessor which sends digital signals to the power relays to form the desired configuration. Alternatively, the relays can be manually operated by a user.

As used herein, the term microprocessor is not limited to integrated circuits referred to in the art as a processor or microprocessor. The term broadly refers to a computer, an application specific integrated circuit, and any other programmable circuit. It should be understood that the microprocessor execute instructions, or computer programs, stored in memories (not shown) in the microprocessor. The above examples are exemplary only and not intended to limit in any way the definition and/or meaning of the term microprocessor.

By providing the load bank in different load configurations, it can be used in a variety of ways to test a large variety of different power sources, voltages and with various load applications that include balanced and unbalanced phase loading.

The load bank can be used to compensate for the variety of voltages and tests necessary for commissioning a power system, with three phase voltages up to 250 VAC (L-N) with a neutral present, or 250 VAC (L-L) without a neutral present. The table below outlines the different power dissipation levels achievable with the delta/wye configuration according to the invention and compares it with two conventional products to demonstrate how the inventive load bank results in an increase in utility.

| Power Table | | | | | | | |
|---|---|---|---|---|---|---|---|
| | 3 Phase | | | | Single Phase | | |
| Configuration | Voltage | Phase | Step | Power | Voltage | Step | Power |
| Wye | 240VACL-N | A | 1 | 400 | 240VAC L-N | 1 | 400 |
| | | | 2 | 800 | | 2 | 400 |
| | | | 3 | 1600 | | 3 | 400 |
| | | | 4 | 3200 | | 4 | 800 |
| | | B | 1 | 400 | | 5 | 800 |
| | | | 2 | 800 | | 6 | 800 |
| | | | 3 | 1600 | | 7 | 1600 |
| | | | 4 | 3200 | | 8 | 1600 |
| | | C | 1 | 400 | | 9 | 1600 |
| | | | 2 | 800 | | 10 | 3200 |
| | | | 3 | 1600 | | 11 | 3200 |
| | | | 4 | 3200 | | 12 | 3200 |
| | | Total | — | 18000 | | Total | 18000 |
| | 120VAC L-N | A | 1 | 100 | 120VAC L-N | 1 | 100 |
| | | | 2 | 200 | | 2 | 100 |
| | | | 3 | 400 | | 3 | 100 |
| | | | 4 | 800 | | 4 | 200 |
| | | B | 1 | 100 | | 5 | 200 |
| | | | 2 | 200 | | 6 | 200 |
| | | | 3 | 400 | | 7 | 400 |
| | | | 4 | 800 | | 8 | 400 |
| | | C | 1 | 100 | | 9 | 400 |
| | | | 2 | 200 | | 10 | 800 |

-continued

| | | Power Table | | | | |
|---|---|---|---|---|---|---|
| | | | 3 | 400 | 11 | 800 |
| | | | 4 | 800 | 12 | 800 |
| | | Total | — | 4500 | Total | 4500 |
| Delta | 208VAC L-L | A | 1 | 300 | | |
| | | | 2 | 600 | | |
| | | | 3 | 1200 | | |
| | | | 4 | 2400 | | |
| | | B | 1 | 300 | | |
| | | | 2 | 600 | | |
| | | | 3 | 1200 | | |
| | | | 4 | 2400 | | |
| | | C | 1 | 300 | | |
| | | | 2 | 600 | | |
| | | | 3 | 1200 | | |
| | | | 4 | 2400 | | |
| | | Total | — | 13500 | | |

| Voltage | Step | Power |
|---|---|---|
| Standard 3 Phase Load Bank | | |
| 240VAC L-N | 1 | 1000 |
| | 2 | 2000 |
| | 3 | 3000 |
| | 4 | 4000 |
| | 5 | 8000 |
| | — | 18000 |
| 120VAC L-N | 1 | 250 |
| | 2 | 500 |
| | 3 | 750 |
| | 4 | 1000 |
| | 5 | 2000 |
| | — | 4500 |
| Standard Singe Phase Load Bank | | |
| 240VAC L-N | 1 | 1000 |
| | 2 | 2000 |
| | 3 | 3000 |
| | 4 | 4000 |
| | 5 | 8000 |
| | — | 18000 |
| 120VAC L-N | 1 | 250 |
| | 2 | 500 |
| | 3 | 750 |
| | 4 | 1000 |
| | 5 | 2000 |
| | — | 4500 |

Figure 3:
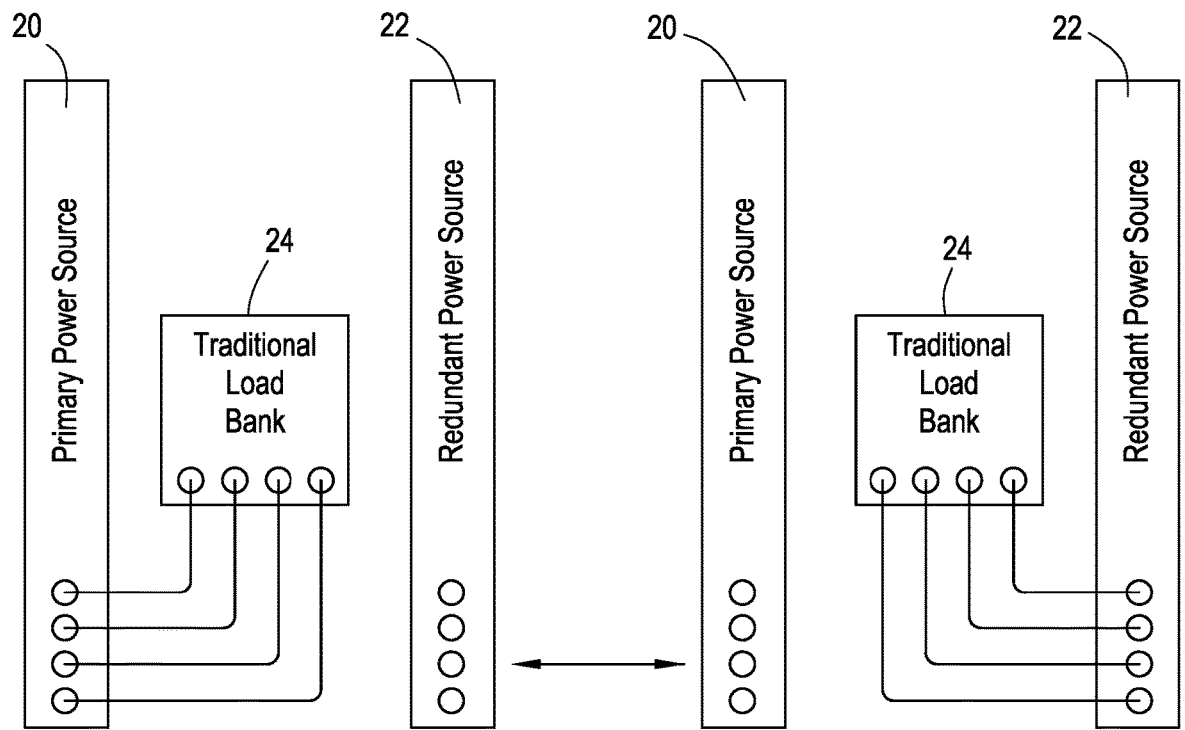
FIG. 3 is a schematic view of a load bank for testing primary and redundant power sources according to the prior art.

FIG. 3 is a schematic diagram representing a testing procedure for a data center installation having primary 20 and redundant 22 power sources, the primary source being powered by the electrical grid and the redundant source being powered by a backup generator. To thoroughly test the power infrastructure, both sources must be tested. Conventional load banks 24 are capable of being connected to the primary source to test it, then must be physically disconnected and reconnected to the redundant source to test it. This process is time consuming and labor intensive. Further, in the event of a primary power source interruption, it is critical that the backup source is immediately available. Because the testing methodology of the prior art takes minutes per load bank, it is impossible to simulate a failure event in a realistic timeframe.

Figure 4:
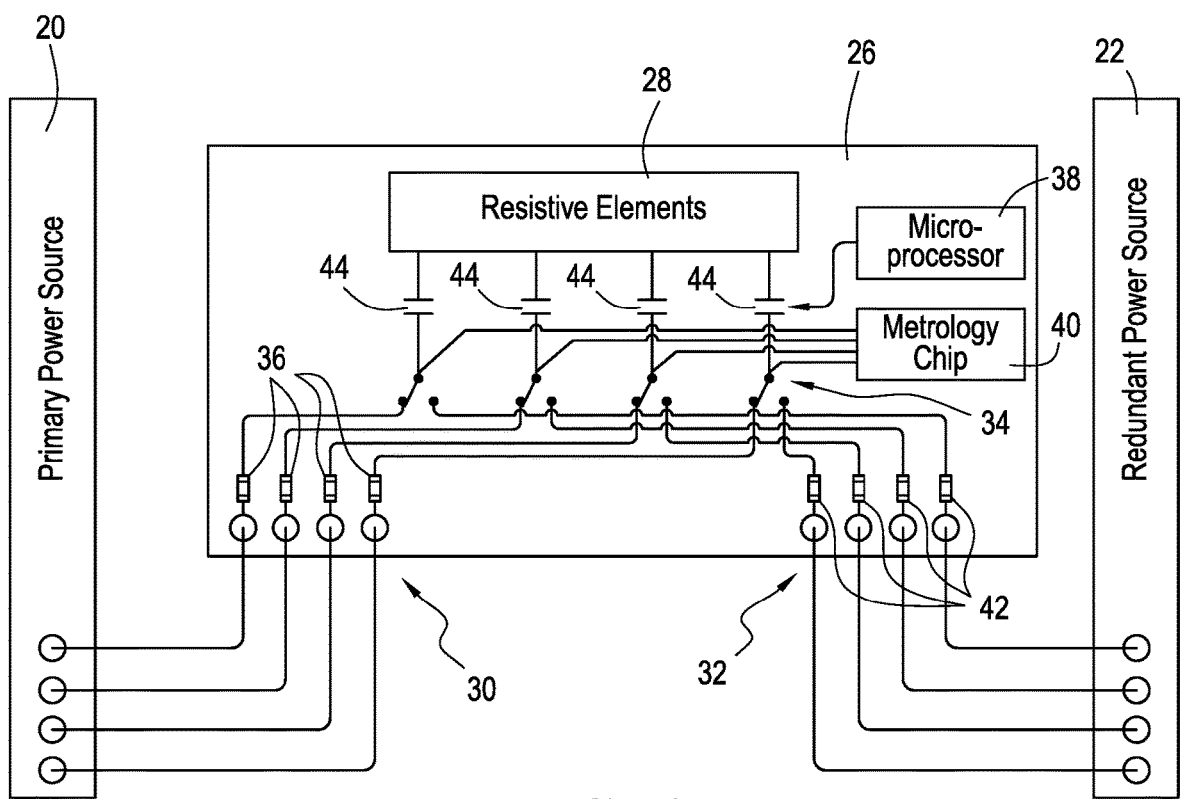
FIG. 4 is a schematic view of a load bank auto transfer circuit operable between primary and redundant sources according to the invention.

Referring now to FIG. 4, there is shown a load bank 26 operable to independently test both a primary power source 20 and a redundant power source 22. The load bank includes a plurality of resistive elements arranged as a load resistor assembly 28, a first set of power connections 30 connected with the primary power source 20 and a second set of power connections 32 connected with the redundant power source 22. In the embodiment shown, each power connection is a 4-wire connection. However, it would be relatively apparent to those of ordinary skill in the art that any number of wire connections may be provided in accordance with the requirements of the source being tested. A multi-pole relay 34 is arranged between the load resistor assembly 28 and the first and second power connections 30, 32. In the example shown, the relay is a 4-pole double throw relay where the first set of power connections 30 feeds the normally closed contacts, the second set of power connections feeds the normally open contacts, and the common contacts are connected to the resistive elements of the load resistor assembly which test the load. Both sets of power connections are then able to feed a single set of resistors while remaining completely electrically isolated from one another. Because the primary and redundant power supplies may be at different voltages or out of phase with one another, this is critical to the design.

When the multi-pole relay 34 is operated to configure the load bank to test the primary power source, electricity flows through a series of fuses 36 and on to the normally closed contacts and reaches a circuit designed to monitor and protect against voltages which may be detrimental to the machine. If the primary power source is adequate, a series of relays allow electricity to reach the resistive elements thus putting a load on the primary source. By making a selection within a custom software program within a microprocessor 38, a command can be sent to the load bank via a metrology chip 40 which results in the multi-pole double throw relay 34 being energized. This cuts the primary power source and enables the redundant power source. Similarly, electricity flows through fuses 42 to the resistive elements for testing.

Preferably, a protective circuit including a plurality of contactors 44 is arranged between the resistive elements of the load resistor assembly and the multi-pole double throw relay 34. Because of the way the circuit is designed, a single set of protection devices may be used to monitor both power supplies, which yields a savings in weight, cost, and complexity. Furthermore, from the time the user chooses to simulate the loss of the primary power source and pick up of the redundant power source, a few things must happen. The microprocessor must react to the command and the multi-pole double throw relay must switch states. Then the protection circuit must feed data to the microprocessor for evaluation. After testing of the primary power source is completed, another signal is sent to close the relays of the multi-pole double throw relay which allow the resistive elements of the load resistor assembly 28 to engage. This entire sequence of events takes less than 500 milliseconds. Because switching and testing utilizing the invention can be done two orders of magnitude faster than testing using conventional load banks, it increases the integrity of the test by more realistically simulating a failure event. Furthermore, the improved method drastically reduces labor required to thoroughly complete the testing. In an installation with 200 load banks, a savings of 10 minutes per load bank yields over 30 hours of labor savings. It also accelerates the schedule of the testing which benefits the customer.

Figure 5:
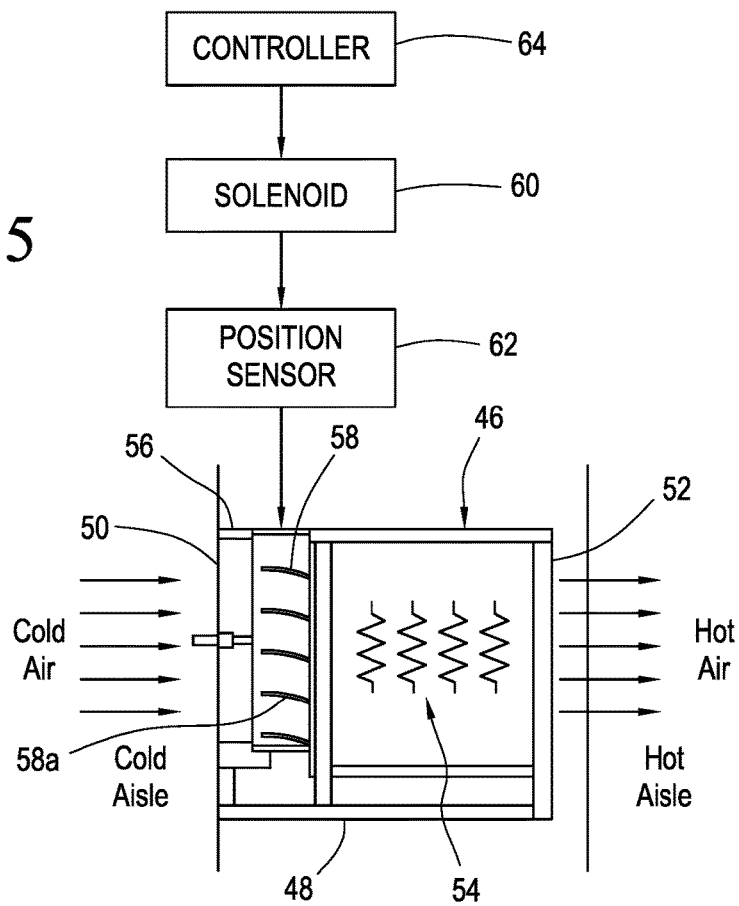
FIG. 5 is a schematic view of a load bank damper assembly according to the invention.

Referring now to FIG. 5, an improved cooling mechanism for a load bank 46 according to the invention will now be described. The load bank includes a housing 48 including a cold air inlet 50 in one side thereof and a hot air outlet 52 in a side of the housing opposite the cold air inlet. A load resistor assembly 54 is arranged within the housing. As is known in the art, the load resistor assembly generates excessive heat when the load bank is in operation. To help circulate cold air through the housing, a blower 56 is arranged in the housing adjacent the cold air inlet 50. The cold air originates in a cold air aisle which may be a conduit from a cooling device, not shown. Hot air is directed to a hot air aisle. The load resistor assembly is cooled via heat exchange with the cold air circulated by the blower to generate hot air which exits the housing via the hot air outlet 52. A damper 58 is arranged in the housing between the blower and the load resistor assembly and is operable between an open position when the load bank is in an operating condition wherein cold air from the blower is delivered to the load resistor assembly and a closed position when the load bank is in a non-operating condition wherein cold air is prevented from passing to the load resistor assembly.

Preferably, the damper 58 is formed of a plurality of damper blades 58a which are linked together so that they move in sync between the open and closed position. A solenoid 60, which is preferably an electric solenoid, is used to displace the damper blades and a position sensor 62, preferably formed of one or more Hall effect sensors, is connected between the solenoid and the damper blades to positively identify the position of the damper to prevent operation of the load bank if the damper blades are jammed or the solenoid fails. A controller 64 controls the operation of the solenoid.

Figure 6:
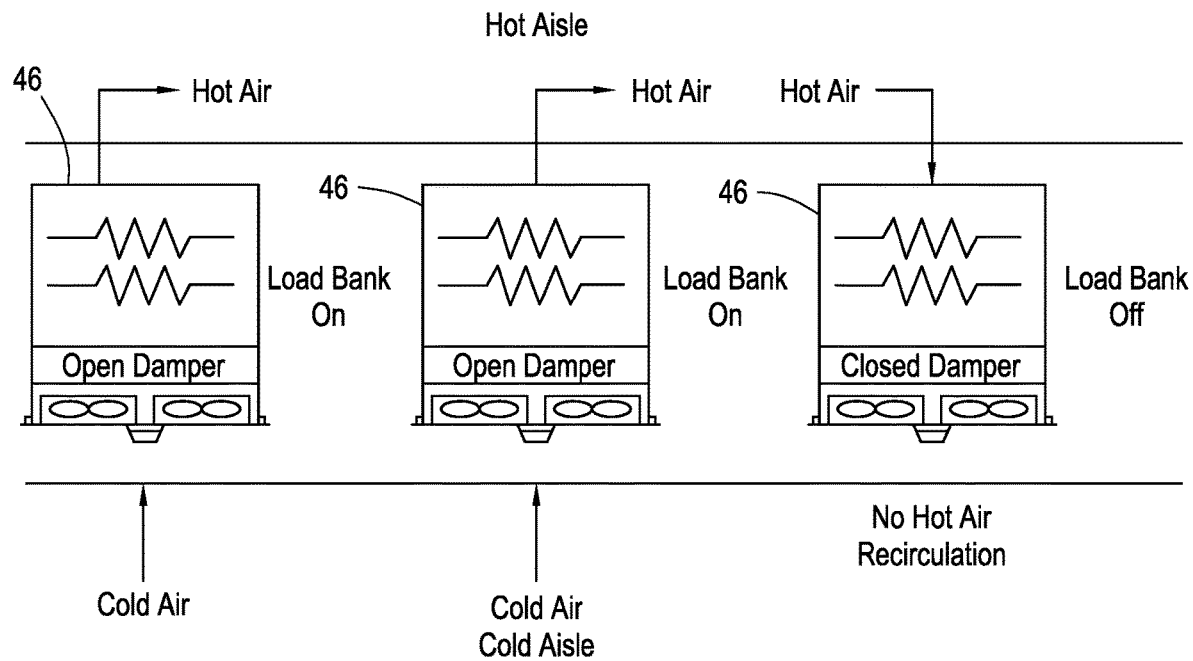
FIG. 6 is a detailed view of a plurality of load banks each having a damper under different operating conditions.

In practice, a number of separate load banks 46 may be used in a testing procedure. These banks have a common cold air aisle and a common hot air aisle as shown in FIG. 6. However, not all of the load banks are necessarily operating at the same time. When one of the load banks is turned off, the damper of that load bank automatically closes so that hot air is unable to recirculate. This preserves the accuracy of the test results and improves safety. Because the cooling process is automated under control of the controller 64, it eliminates the need for manual labor resulting in cost and time savings to the customer.

While the preferred forms and embodiments of the invention have been illustrated and described, it will be apparent to those of ordinary skill in the art that various changes and modifications may be made without deviating from the inventive concepts set forth above.

What is claimed is:

1. A load bank and cooling assembly, comprising
(a) a housing including a cold air inlet on one side and a hot air outlet on a side opposite said cold air inlet;
(b) a load resistor assembly arranged in said housing;
(c) a blower arranged within said housing adjacent said cold air inlet for circulating cold air through said load resistor assembly to cool said load resistor assembly via heat exchange resulting in hot air which exits said housing via said hot air outlet; and
(d) a damper arranged in said housing between said blower and said load resistor assembly and operable between an open position when the load bank is in an operating condition wherein cold air from said blower is delivered to said load resistor assembly and a closed position when the load bank is in a non-operating condition wherein hot air is prevented from being recirculated.

2. The load bank and cooling assembly as defined in claim 1, and further comprising a solenoid connected with said damper for operating said damper between said open and closed positions.

3. The load bank and cooling assembly as defined in claim 2, and further comprising a position sensor connected between said solenoid and said damper for detecting a position of said damper.

4. The load bank and cooling assembly as defined in claim 2, wherein said damper comprises a plurality of linked damper blades which are simultaneously displaced between said open and closed positions by said solenoid.

5. The load bank and cooling assembly as defined in claim 2, wherein a plurality of separate load banks are provided in a load bank assembly having a common cold air supply aisle and a common hot air aisle, each load bank being independently operated between operating and non-operating conditions, whereby hot air is prevented by a damper from being recirculated via a load bank in a non-operating condition.

6. A load bank for testing power sources, comprising
(a) a load resistor assembly comprising a plurality of resistors which may be switched between delta and wye configurations for testing a variety of voltages and power sources requiring various load applications;

(b) first and second power connections connected with primary and redundant power sources;

(c) a relay for alternately connecting said first and second power connections with said load resistor assembly for alternately testing said primary and redundant power sources while maintaining said primary and redundant power sources electrically isolated; and (d) a damper arranged adjacent said load resistor assembly and operable between an open position which permits cold air to be delivered to said load resistor assembly to cool said assembly when said load bank is operating and a closed position which prevents hot air from being recirculated when said load bank is not operating.

\* \* \* \* \*